United States Patent

Shibuya et al.

[11] Patent Number: 5,866,296
[45] Date of Patent: Feb. 2, 1999

[54] PHOTOSENSITIVE RESIN COMPOSITION

[75] Inventors: Toru Shibuya; Noriaki Tochizawa; Mitsuharu Miyazaki; Hideo Kikuchi, all of Funabashi, Japan

[73] Assignee: Toyo Gosei Co., Ltd., Chiba, Japan

[21] Appl. No.: 845,450

[22] Filed: Apr. 25, 1997

Related U.S. Application Data

[63] Continuation of Ser. No. 591,776, Jan. 25, 1996, abandoned.

[51] Int. Cl.$^6$ ........................................... G03F 7/012
[52] U.S. Cl. ..................... 430/195; 430/167; 430/196; 430/926
[58] Field of Search ..................... 430/195, 196, 430/167, 926

[56] References Cited

U.S. PATENT DOCUMENTS

| | | | |
|---|---|---|---|
| 3,072,485 | 1/1963 | Reynolds et al. | 430/195 |
| 3,528,812 | 9/1970 | Danhäuser et al. | 430/195 |
| 3,528,814 | 9/1970 | Riester et al. | 430/195 |
| 4,065,524 | 12/1977 | Laridon et al. | 430/195 |
| 4,119,466 | 10/1978 | Van Allen et al. | 430/195 |
| 4,147,552 | 4/1979 | Specht et al. | 430/195 |
| 4,241,162 | 12/1980 | Hatano et al. | 430/195 |

FOREIGN PATENT DOCUMENTS

| | | |
|---|---|---|
| 1302348 | 6/1989 | Japan . |
| 292905 | 4/1990 | Japan . |
| 2173007 | 7/1990 | Japan . |
| 2204750 | 8/1990 | Japan . |
| 426849 | 1/1992 | Japan . |
| 5197141 | 1/1993 | Japan . |
| 511442 | 5/1993 | Japan . |

OTHER PUBLICATIONS

Journal of Photopolymer—Science and Technology; vol. 8 1995, Japanese Patent Publication No. 565761 (1981).

*Primary Examiner*—John S. Chu
*Attorney, Agent, or Firm*—Huntley & Associates

[57] ABSTRACT

A photosensitive resin composition includes a polymer compound having a component of Formula (I) and a sensitizer having a cationic group in the molecule:

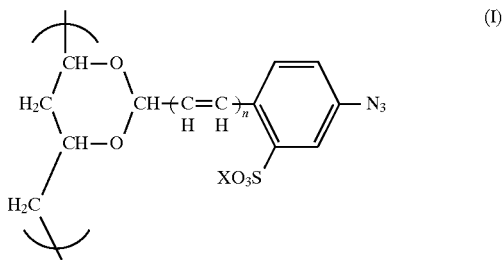

(wherein X denotes a cationic species, and n is 0, 1 or 2.) The photosensitive resin composition is high in sensitivity, good in storage stability, and easy to produce, and is suitable for use in a screen printing plate, formation of black matrix or phosphor pattern of a color cathode-ray tube, a CCD or LCD color filter, a printing color proof, and various etching resists.

10 Claims, No Drawings

PHOTOSENSITIVE RESIN COMPOSITION

This application is a continuation of application Ser. No. 08/591,776, filed Jan. 25, 1996, now abandoned.

FIELD OF THE INVENTION

This invention relates to a photosensitive resin composition, more specifically to a water-soluble photosensitive resin composition which is high in sensitivity, good in storage stability over time, and easy to produce.

BACKGROUND OF THE INVENTION

Heretofore, as water-soluble photosensitive resin compositions for the formation of a screen printing plate, the formation of black matrix or phosphor pattern of a color cathode-ray tube or the formation of a color filter of CCD and LCD, natural proteins such as gelatin, casein, and glue combined with a bichromate salt, or water-soluble polymers such as hydrolyzed polyvinyl acetate combined with a diazonium salt have been used. However, these photosensitive resin compositions have problems of environmental pollution and poor storage stability.

Further, a photosensitive resin composition based on a water-soluble polymer such as polyvinylpyrrolidone combined with a water-soluble bisazide compound is also used. However, this composition has a problem of low sensitivity.

Therefore, development is being conducted for high-sensitivity photosensitive resins. For example, Laid-open Japanese Patent Application Nos. 4-26849(1992), 2-204750 (1990), 2-173007(1990), 2-92905(1990), 1-302348(1989), 5-197141(1993), and 5-11442(1993) disclose azide polymers having azide groups in the side chain as high-sensitivity photosensitive resins.

These azide polymers are high in sensitivity, but still have problems of complicated production process and poor storage stability.

Further, as a water-soluble photosensitive resin which is high in sensitivity and good in storage stability, Japanese Patent Publication 565761(1981) discloses styrylpyridinium group pendant polyvinylalcohol (abbreviated as "SbQ-PVA"), but this photosensitive resin has a problem in that a satisfactory resolution cannot be obtained because the photosensitive resin is inferior in water resistance and thus tends to swell during developing.

SUMMARY OF THE INVENTION

With a view to eliminate such prior art problems, a primary object of the present invention is to provide a water-soluble photosensitive resin composition which is high in sensitivity and resolution, good in storage stability, and easy to produce.

The inventors have conducted intensive studies to attain the above object, found that a photosensitive resin composition comprising a polymer compound having a component of Formula (I) and a sensitizer having a cationic group in the molecule attains the above object, and accomplished the present invention.

In accordance with the present invention, which is based on the above findings, there is provided a photosensitive resin composition comprising a polymer compound having a component of Formula (I) and a sensitizer having a cationic group in the molecule.

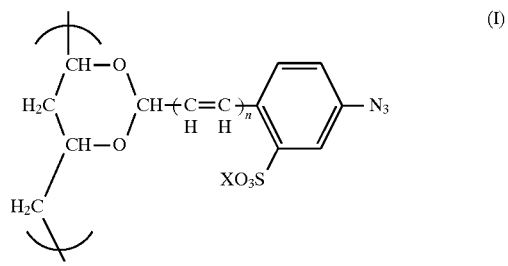

(wherein X denotes a cationic species, and n is 0, 1, or 2.)

Further, the photosensitive resin composition of the present invention is characterized in that n of Formula (1) is zero.

Still further, the photosensitive resin composition of the present invention is characterized in that the cationic group of the sensitizer having a cationic group in the molecule is quaternary ammonium group.

The polymer compound having a component of Formula (I) used in the composition of the present invention is easily obtained by reacting a hydrolyzed polyvinylacetate or a water-soluble copolymer of vinyl alcohol and another vinyl compound with an aldehyde of Formula (II):

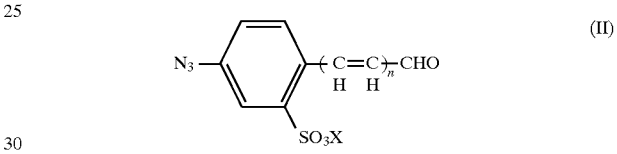

or an acetal of Formula (III) in the presence of an acid catalyst.

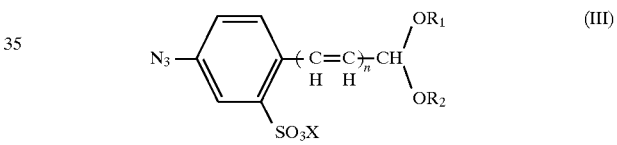

(wherein $R_1$ and $R_2$ are individually lower alkyl groups, or the both form an alkylene group.)

The hydrolyzed polyvinylacetate used in the above reaction preferably has an average degree of polymerization of about from 200 to 5,000 and a degree of hydrolysis of about from 60 to 100%.

If the degree of polymerization is smaller than about 200, the sensitivity is not sufficient, and if the degree of polymerization is higher than about 5,000, the resulting photosensitive composition solution has a high viscosity and poor applicability. If the concentration of the composition solution is decreased to reduce the viscosity, it is difficult to obtain the desired coating thickness. Both are therefore not desirable.

If the degree of hydrolysis is lower than about 60%, sufficient water solubility and water developability cannot be obtained.

The hydrolyzed polyvinylacetate can also be a hydrolyzed modified polyvinylacetate modified with hydrophilic group, lipophilic group, anionic group, cationic group, or reactive group such as acetoacetyl group.

The vinyl monomer copolymerizable with vinyl alcohol can be, for example, N-vinylpyrrolidone and acrylamide.

When the hydrolyzed polyvinylacetate and the compound of Formula (II) or (III) are reacted in the presence of an acid catalyst, aldehydes such as formaldehyde, acetaldehyde, propionaldehyde, butylaldehyde, benzaldehyde, and hydroxybenzaldehyde or acetals thereof can be simultaneously reacted.

The amount of the azide compound of Formula (II) or (III) based on the amount of the hydrolyzed polyvinylacetate is preferably about from 0.1 to 5.0 mole % per monomer unit.

If the amount is smaller than about 0.1 mole %, a satisfactory cured film cannot be obtained, and if the amount is more than about 5.0 mole %, evolution of nitrogen gas due to decomposition of the azide increases, resulting in decreased adhesion of the photosensitive film to the substrate.

The number n in Formula (II) or (III) is 0, 1 or 2. These compounds may be used alone or as mixtures thereof, and a reaction mixture of an aldehyde of n=0 and acetaldehyde may be used, as is.

In particular, when a reaction mixture of an aldehyde of n=0 and acetaldehyde is used, the production process is simplified. Further, since the azide compound of n=1 or 2 has a longer absorption wavelength than that of the azide compound of n=0, it is preferable because the photoreactivity is even further improved.

X in Formula (1) denotes a catiordc species, which includes Li, Na, ammonium, and the like.

The sensitizer used in the composition of the present invention is one which has at least one cationic group such as ammonium group, phosphonium group, sulfonium group, and oxonium group in the molecule. Of these, the ammonium group is preferable for simple production. Preferable examples (S-1 to S-26) of the sensitizer are shown below.

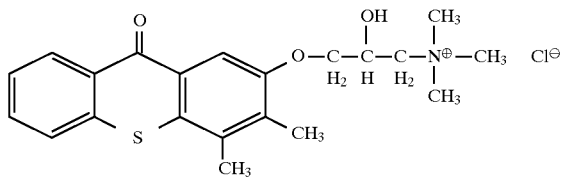
S-1

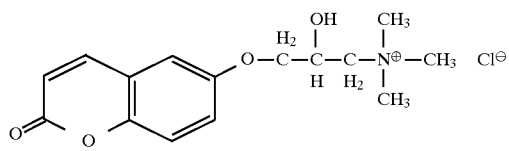
S-2

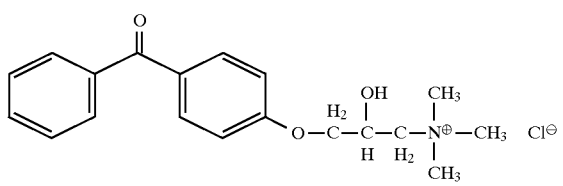
S-3

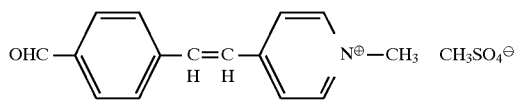
S-4

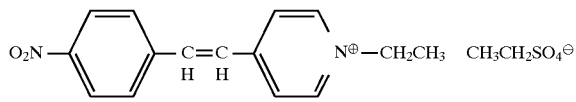
S-5

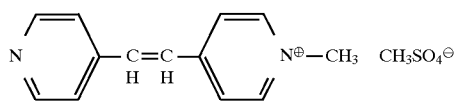
S-6

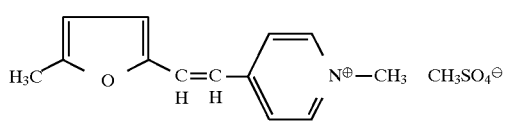
S-7

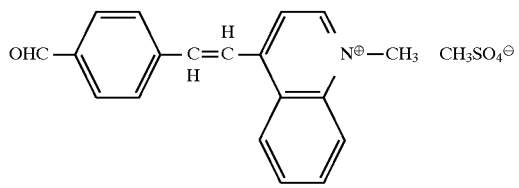
S-8

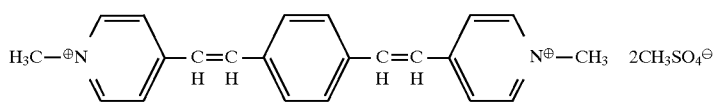
S-9

-continued
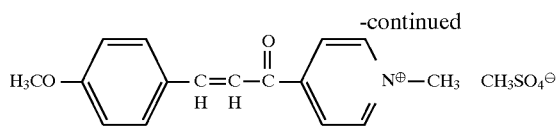 S-10
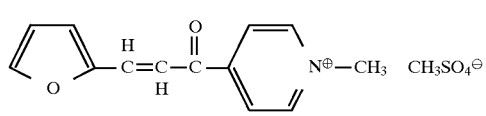 S-11
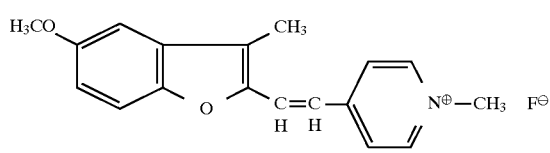 S-12
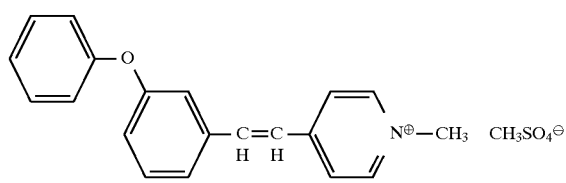 S-13
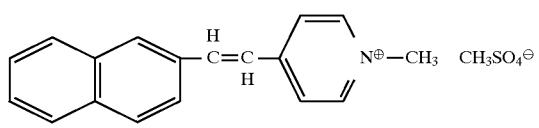 S-14
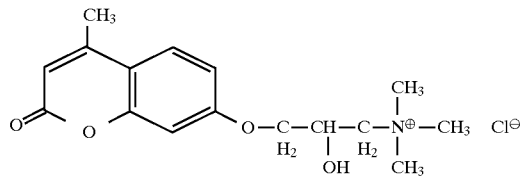 S-15
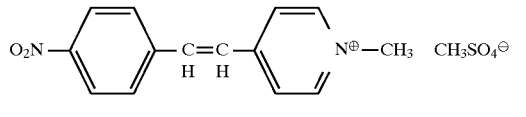 S-16
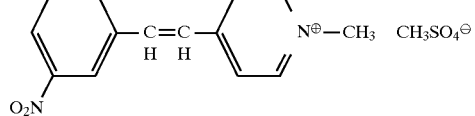 S-17
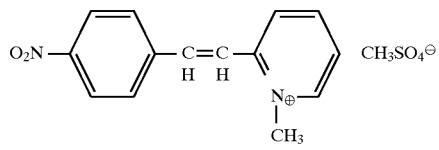 S-18
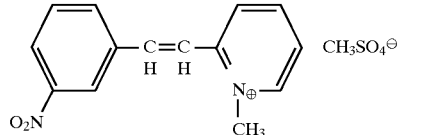 S-19
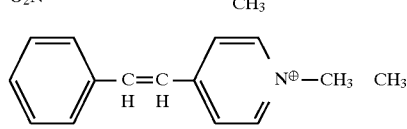 S-20
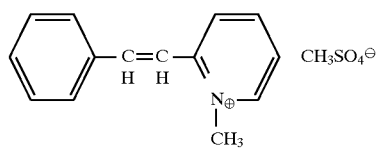 S-21

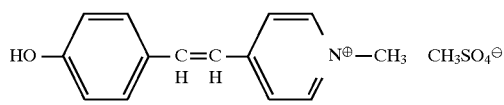
S-22

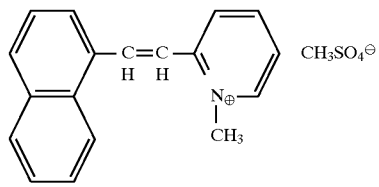
S-23

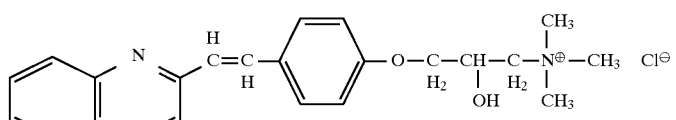
S-24

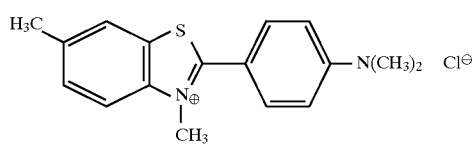
S-25

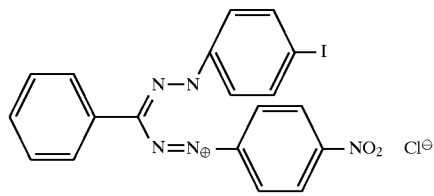
S-26

Further, Uvitex BAC (a cationic benzimidazole derivatives of CIBA-GEIGY) can also be used.

In the composition of the present invention, the amount of the sensitizer having a cationic group in the molecule based on the structural unit of Formula (I) is preferably about from 10 to 100 mole %.

This is because if the amount is less than about 10 mole %, a slight sensitizing effect is obtained, but the photoreaction rate of the azide group is low, and the effect of the introduced azide group is not sufficiently obtained. If the amount exceeds about 100 mole %, the water developability tends to be deteriorated, and adhesion to the substrate is decreased. Therefore, both cases are not preferable. If an amount of more than about 100 mole % is added, further improved sensitizing effect is not obtained.

The sensitivity can be even further improved by adding a polymer compound other than those described above to the composition of the present invention, specifically a polymer compound containing a group liable to undergo photoreaction with the azide group such as pyrrolidone or amide structure.

Examples of such polymer compound include polyvinyl pyrrolidone, a copolymer of diacetoneacrylamide and acrylamide, polyacrylamide, and the like.

To improve the properties such as strength and water resistance of the coating film, the composition of the present invention can be mixed with a polymer emulsion. The polymer emulsion includes, for example, polyvinylacetate emulsion, vinylacetate - ethylene copolymer emulsion, vinylacetate - acrylic ester copolymer emulsion, polystyrene emulsion, ethylene - butadiene copolymer emulsion, styrene - acrylic ester copolymer emulsion, acetonitrile - butadiene copolymer emulsion, chloroprene polymer emulsion, polyvinyl chloride emulsion, silicone resin emulsion, polyurethane emulsion, and the like.

In addition to the above, the composition of the present invention can be incorporated, as necessary, with appropriate amounts of a surfactant for improving the applicability and developability, an adhesion auxiliary for improving adhesion, a dye or pigment for preventing halation, a preservative, a defoamer, and the like.

The composition of the present invention can be prepared by dissolving or dispersing the above-descibed polymer compound having an azide group in the side chain, the sensitizer having a cationic group in the molecule, and as necessary, various additives in a solvent mainly comprising water.

The solvent used in this case is generally water, but in addition to this, a water-soluble solvent such as methyl alcohol, ethyl alcohol, isopropyl alcohol, acetone, tetrahydrofuran, dioxane, dimethylformamide, N-methyl pyrrolidinone, or ethyleneglycol monomethylether or ethyleglycol monoethylether, and the like can be added in an amount of less than about 50% by weight.

The photosensitive resin composition of the present invention obtained as above is used, according to the application, by coating on a substrate such as a metal plate of aluminum or stainless steel, a screen mesh, paper, a glass plate, semiconductor substrate, or the like to a dry thickness of about from 0.1 to 1,000 um, followed by drying.

The coating film is irradiated with ultraviolet light, that is, an active radiation of about from 300 to 500 nm in wavelength to harden the irradiated portion, and then the unirradiated portion is removed by washing with water to obtain an image pattern, which can be utilized, for example, as a screen printing plate, formation of black matrix or phosphor pattern of a color cathode-ray tube, a color filter for CCD or LCD, a printing color proof or various etching resists, or the like.

DETAILED DESCRIPTION OF PREFERRED EXAMPLES

The present invention will be described further in detail with reference to the examples. Unless otherwise stated, percentages are expressed as % by weight.

(Synthesis Examples)

Synthesis Example I (Polymer Compound P-1 Containing Azide Group)

Polyvinylalcohol (GH-17: Nippon Synthetic Chemical Industry) in an amount of 50 g was dissolved in 200 ml of water. 170 g of a 2.4% aqueous solution of p-azidebenzaldehyde-o-sulfonic acid was added, and reacted at 50° C. for 10 hours.

After completion of the reaction, the reaction mixture was cooled, 19.5 g of 5% aqueous NaOH solution was added to neutralize and complete acetalization to obtain an aqueous solution of polymer compound P-1.

The aqueous solution was re-precipitated with acetone. The content of the azide group introduced in the product was 1.6 mole % measured spectrophotometrically.

Synthesis Example 2

(Polymer Compound P-2 Containing Azide Group)

Polyvinylalcohol (EG-30: Nippon Synthetic Chemical Industry) in an amount of 50 g was dissolved in 200 ml of water.

1.03 g of sodium p-azidebenzaldehyde-o-sulfonate and 170 g of a 2.4% aqueous solution of p-azidebenzaldehyde-o-sulfonic acid were added, and reacted at 30° C. for 24 hours.

After completion of the reaction, the reaction mixture was cooled, 19.5 g of 5% aqueous NaOH solution was added to neutralize and complete acetalization to obtain an aqueous solution of polymer compound P-2.

The aqueous solution was re-precipitated with acetone. The content of the azide group introduced in the product was 2.0 mole % measured spectrophotometrically.

Synthesis Example 3

(Polymer Compound P-3 Containing Azide Group)

Sodium p-azidebenzaldehyde-o-sulfonate in an amount of 10 g (0.046 mole) and 10.14 g (0.23 mole) of acetaldehyde were dissolved in 160 ml of water. After the solution was cooled to 2°–3° C., 9.2 g of 10% aqueous sodium hydroxide solution was added, and reacted at 2°–3° C. for 4 hours, and further at 60° C. for 1.5 hour under agitation, After the resulting reaction mixture was mixed with sodium chloride for salting out, the product was purified from isopropyl alcohol/water to obtain an orange crystal.

The crystal was analyzed by way of high-performance liquid chromatography, and showed to be a mixture of 38.5% of sodium pazidealdehyde-o-sulfonate (in Formula (II), n=0 and X=Na), 34.2% of sodium p-azidecinnamaldehyde-o-sulfonate (in Formula (II), n=1 and X=Na), and 15.6% of an aldehyde of Formula (11) wherein n=more than 2 (X=Na).

Polyvinylalcohol (EG-30: Nippon Synthetic Chemical Industry) in an amount of 50 g was dissolved in 200 ml of water, 4.3 g of the above orange crystal and 1.5 g of phosphoric acid were added thereto, and reacted at 40° C. for 15 hours. The reaction mixture was treated with an ion exchange resin to remove the phosphoric acid catalyst to prepare an aqueous solution of polymer compound P-3 containing azide group.

Synthesis Example 4

(Polymer Compound P-4 Containing Azide Group)

Using the same procedure as in Synthesis Example 2, except that EG-30 of Synthesis Example 2 was replaced with acrylamide-modified polyvinylalcohol (EP-240: Denki Kagaku Kogyo), an aqueous solution of polymer compound P-4 containing azide group was obtained.

Synthesis Example 5

(Polymer Compound P-5 Containing Azide Group)

Polyvinylalcohol (GH-17: Nippon Synthetic Chemical Industry) in an amount of 50 g was dissolved in 200 ml of water. 170 g of a 2.4% aqueous solution of sodium p-azidebenzaldehyde-o-sulfonate and 3.6 g of crotonaldehyde were added, and reacted at 30° C. for 24 hours. After completion of the reaction, the reaction mixture was cooled, neutralized with 19.5 g of 5% aqueous sodium hydroxide solution to obtain an aqueous solution of polymer compound P-5 containing azide group.

Examples 1 to 20

Next, using the polymer compounds obtained in Synthesis Examples 1 to 5, Examples 1 to 20 and Comparative Examples 1 to 3 were carried out.

Sensitivity

Ten grams of an aqueous solution of polymer compounds P-1 to P-4 containing azide group obtained in Synthesis Examples 1 to 5 was mixed with the sensitizer having a cationic group shown in the table and 7 g of water to dissolve the compound and filtered to prepare a photosensitive composition, respectively.

These compositions were spin coated on a glass substrate, and dried at 70° C. for 20 minutes to form a photosensitive layer with a film thickness of 1.2 um, respectively.

The photosensitive layers were exposed to light of an ultra-high pressure mercury lamp, respectively, through Fuji Step Guide at an intensity of illuminance of 5.0 mW/cm$^2$ (measured using the ORC ultraviolet illuminator UV-MO I with a UV- 3 5 sensor).

After the exposure, the photosensitive layer was developed with water, the cured film was dyed with 1% methylene Blue, and the sensitivity was evaluated from the number of cured steps.

The results are shown in Table 1.

TABLE 1

| Example | Polymer compound of Synth. | Other polymer compound | Sensitizer (g) | Number of cured steps Exposure time (sec) | | | | | |
|---|---|---|---|---|---|---|---|---|---|
| | | | | 5 | 20 | 40 | 70 | 100 | 150 |
| Comp. Ex. 1 | P-1 | — | — | — | — | — | — | 0 | 0 |
| Example 1 | P-1 | — | S-1 (0.1) | — | 6 | 9 | — | — | — |
| Example 2 | P-1 | — | S-1 (0.05) | — | 3 | 6 | 9 | — | — |
| Example 3 | P-1 | — | S-1 (0.015) | — | — | 1 | 2 | 3 | — |
| Example 4 | P-1 | — | S-3 (0.1) | — | — | — | — | 0 | 3 |
| Example 5 | P-1 | — | S-4 (0.15) | — | 4 | 8 | — | — | — |
| Example 6 | P-1 | — | S-5 (0.1) | — | 5 | 7 | — | — | — |
| Example 7 | P-1 | — | S-6 (0.1) | — | 0 | 1 | 2 | 3 | — |
| Example 8 | P-1 | — | S-7 (0.1) | — | 0 | 1 | 2 | 3 | — |
| Example 9 | P-1 | — | S-8 (0.1) | — | 4 | 7 | — | — | — |
| Example 10 | P-1 | — | S-12 (0.1) | — | — | — | — | 3 | — |
| Example 11 | P-1 | — | S-13 (0.1) | — | — | — | — | 1 | — |
| Example 12 | P-1 | — | S-14 (0.1) | — | — | — | — | 1 | — |
| Comp. Ex. 2 | P-2 | — | — | — | — | — | — | 0 | 0 |
| Example 13 | P-2 | — | S-9 (0.1) | — | 1 | 3 | 5 | — | — |
| Example 14 | P-2 | — | S-10 (0.1) | — | 3 | 4 | 6 | — | — |
| Example 15 | P-2 | — | S-11 (0.1) | — | 1 | 3 | 5 | — | — |
| Comp. Ex. 3 | P-3 | — | — | 2 | 10 | — | — | — | — |
| Example 16 | P-3 | — | S-1 (0.1) | 7 | — | — | — | — | — |
| Example 17 | P-4 | — | S-1 (0.1) | 4 | — | — | — | — | — |
| Example 18 | P-5 | — | S-1 (0.1) | 5 | — | — | — | — | — |
| Example 19 | P-1 | PVP* | S-1 (0.1) | 4 | — | — | — | — | — |
| Example 20 | P-1 | PVP* | S-1 (0.1) | 7 | — | — | — | — | — |

*10 g of 6 wt. % aqueous solution of polyvinylpyrrolidone

As can be seen from Table 1, the photosensitive compositions of Examples 1 to 20 of the present invention are found to be high in sensitivity as compared with those of Comparative Examples 1 to 3 containing no sensitizer.

Resolution

The composition of Example 1 and SbQ-PVA (SPP-H-13: Toyo Gosei Kogyo) was coated on a glass substrate as described above, and dried to form 1.2 um thick photosensitive layers, respectively. The photosensitive layers were contact exposed through a chromium mask of 50 um patterns, and developed with water, respectively. The resulting 50 um patterns were observed by means of a Nomarrki differential interference microscope, respectively. As a result, SbQ-PVA had wrinkles on the pattern surface, but the composition of Example 1 had a good pattern surface.

Further, exposure were carried out using a 0.15 mm gap provided between the photosensitive layers and the chromium mask, and observed similarly, respectively. As a result, the composition of Example 1 gave a good pattern, whereas SbQ-PVA had a number of fringes.

Examples 21 to 34

Examples 21 to 34 were conducted using the polymer compound obtained in Synthesis Example 1.

Sensitivity

Ten grams of the aqueous solution of polymer compound P-1 containing azide group obtained in Synthesis Example 1, the sensitizer shown in Table 2 and 7 g of water were mixed and filtered to prepare a photosensitive compositions, and evaluated, respectively, using the same procedures as in the above-described examples.

The results are shown in Table 2.

TABLE 2

| Example | Sensitizer | Number of Cured Steps Exposure Time (sec) | | | | |
|---|---|---|---|---|---|---|
| | | 10 | 20 | 30 | 60 | 120 |
| Example 21 | S-16 (0.12) | — | — | 8 | — | — |
| Example 22 | S-17 (0.12) | — | — | 5 | — | — |
| Example 23 | S-18 (0.12) | — | — | 6 | — | — |
| Example 24 | S-19 (0.12) | — | — | 6 | — | — |
| Example 25 | S-20 (0.104) | — | — | 3 | 6 | — |
| Example 26 | S-21 (0.104) | — | — | — | — | 3 |
| Example 27 | S-22 (0.11) | — | — | — | — | 5 |
| Example 28 | S-15 (0.122) | — | — | 4 | — | 8 |
| Example 29 | S-23 (0.122) | — | — | — | — | 3 |
| Example 30 | S-24 (0.1) | 3 | 8 | — | — | — |
| Example 31 | S-25 (0.1) | 5 | 8 | — | — | — |
| Example 32 | S-1 (0.14) | 5 | 8 | — | — | — |
| Example 33 | Uvitex BAC (0.04) | — | 4 | 6 | — | — |
| Example 34 | Uvitex BAC (0.09) | — | 4 | 7 | — | — |

It has been demonstrated from the results shown in Table 2 that the photosensitive resin compositions of Examples 21 to 34 according to the present invention are high in sensitivity as compared with that of Comparative Example 1 which does not contain sensitizers.

As described above, the photosensitive resin composition of the present invention is high in sensitivity, good in storage stability, and easy to produce, and is suitable for use in a screen printing plate, formation of black matrix or phosphor pattern of a color cathode-ray tube, a color filter of CCD or LCD, a printing color proof, and various etching resists.

The present invention has been described in detail with respect to preferred embodiments, and it will now be that changes and modifications may be made without departing from the invention in its broader aspects, and it is the invention, therefore, in the appended claims to cover all such changes and modifications as fall within the true spirit of the invention.

We claim:

1. A photosensitive resin composition comprising a polymer compound having a water-soluble component of Formula (I) and a water-soluble sensitizer having a cationic group in the molecule and wherein the sensitizer is selected from the group comprising thioxanthine moieties having a cationic group, styrylpyridinium moieties and compounds having a component of Formulas S-8, S-10, S-11, S-25 and S-26:

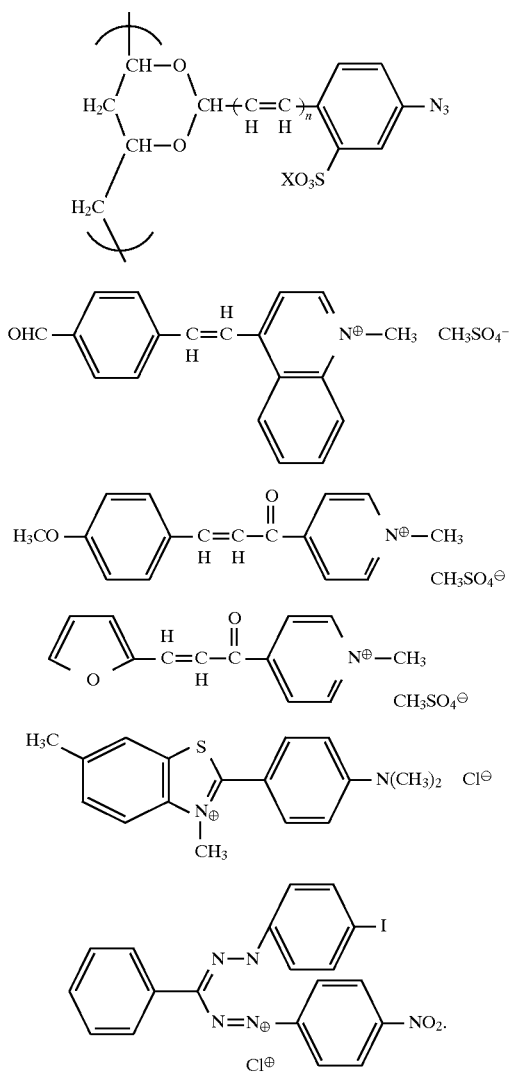

2. A photosensitive resin composition of claim 1, wherein n of Formula (I) is zero.

3. A photosensitive resin composition of claim 1 wherein the thioxanthine moieties having a cationic group are thioxanthine moieties having a quaternary ammonium group.

4. A photosensitive resin composition of claim 1, wherein said polymer compound having a component of Formula (I) is obtained by reacting a hydrolyzed polyvinylacetate or a water-soluble copolymer of vinylalcohol and another vinyl compound with an aldehyde of Formula (II):

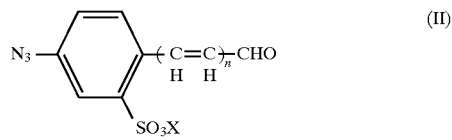

or an acetal of Formula (III) in the presence of an acid catalyst,

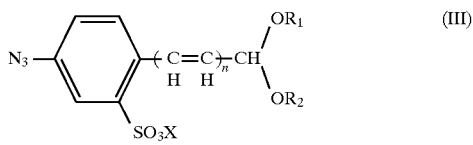

(wherein $R_1$ and $R_2$ are individually lower alkyl groups, or the both form an alkylene group.).

5. A photosensitive resin composition of claim 4, wherein said hydrolyzed polyvinylacetate has an average degree of polymerization of about from 200 to 5,000 and a degree of hydrolysis of about from 60 to 100%.

6. A photosensitive resin composition of claim 4, wherein said hydrolyzed polyvinylacetate is a hydrolyzed modified polyvinylacetate modified with a member selected from the group consisting of hydrophilic group, lipophilic group, anionic group, cationic group, and acetacetyl group.

7. A photosensitive resin composition of claim 4, wherein said watersoluble copolymer is copolymerized with N-vinylpyrrolidone or acrylamide.

8. A photosensitive resin composition of claim 4, wherein the amount of said azide compound of Formula (II) or (III) based on the amount of said hydrolyzed polyvinylacetate is about from 0.1 to 5.0 mole % per monomer unit.

9. A photosensitive resin composition of claim 1, wherein X of Formula (I) denotes a cationic species selected the group consisting of Li, Na, K, and ammonium.

10. A photosensitive resin composition of claim 1, wherein the amount of said sensitizer having a cationic group in the molecule based on the structural unit of Formula (I) is about from 10 to 100 mole %.

* * * * *